(12) United States Patent
Saito

(10) Patent No.: US 12,404,399 B2
(45) Date of Patent: Sep. 2, 2025

(54) THERMOSETTING RESIN SHEET AND PRINTED WIRING BOARD

(71) Applicant: Panasonic Intellectual Property Management Co., Ltd., Osaka (JP)

(72) Inventor: Eiichiro Saito, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 68 days.

(21) Appl. No.: 17/914,690

(22) PCT Filed: Apr. 1, 2021

(86) PCT No.: PCT/JP2021/014226
§ 371 (c)(1),
(2) Date: Apr. 21, 2023

(87) PCT Pub. No.: WO2021/201252
PCT Pub. Date: Oct. 7, 2021

(65) Prior Publication Data
US 2023/0257576 A1    Aug. 17, 2023

(30) Foreign Application Priority Data
Apr. 3, 2020   (JP) .................. 2020-067746

(51) Int. Cl.
*C08L 63/00*    (2006.01)
*C08J 5/24*    (2006.01)
*H05K 1/03*    (2006.01)

(52) U.S. Cl.
CPC .............. *C08L 63/00* (2013.01); *C08J 5/244* (2021.05); *H05K 1/036* (2013.01); *C08J 2363/00* (2013.01); *C08J 2463/00* (2013.01); *C08L 2205/025* (2013.01); *C08L 2205/035* (2013.01); *H05K 2201/0195* (2013.01)

(58) Field of Classification Search
None
See application file for complete search history.

(56) References Cited

U.S. PATENT DOCUMENTS

2020/0100370 A1    3/2020   Ito et al.

FOREIGN PATENT DOCUMENTS

| JP | H03-191595 A | 8/1991 |
|----|--------------|--------|
| JP | H04-047940 A | 2/1992 |
| JP | 2003-037362 A | 2/2003 |
| JP | 2010-056176 A | 3/2010 |
| JP | 2016-219663 A | 12/2016 |
| JP | 2018-113423 A | 7/2018 |

OTHER PUBLICATIONS

International Search Report dated Jun. 22, 2021 issued in International Patent Application No. PCT/JP2021/014226, with English translation.

*Primary Examiner* — Laura C Powers
(74) *Attorney, Agent, or Firm* — Rimon P.C.

(57) ABSTRACT

A thermosetting resin sheet includes a prepreg layer and a resin sheet layer stacked on the prepreg layer. The prepreg layer includes a base member and an uncured product or semi-cured product of a first thermosetting resin composition impregnated into the base member. The resin sheet layer is an uncured product or semi-cured product of a second thermosetting resin composition. A curing time of the resin sheet layer is longer than a curing time of the prepreg layer.

12 Claims, 1 Drawing Sheet

THERMOSETTING RESIN SHEET AND PRINTED WIRING BOARD

CROSS-REFERENCE OF RELATED APPLICATIONS

This application is the U.S. National Phase under 35 U.S.C. § 371 of International Patent Application No. PCT/JP2021/014226, filed on Apr. 1, 2021, which in turn claims the benefit of Japanese Patent Application No. 2020-067746, filed on Apr. 3, 2020, the entire disclosures of which Applications are incorporated by reference herein.

TECHNICAL FIELD

The present disclosure generally relates to a thermosetting resin sheet and a printed wiring board. More particularly, the present disclosure relates to a thermosetting resin sheet which may be used to form an insulating layer of a printed wiring board and a printed wiring board including an insulating layer formed out of the thermosetting resin sheet.

BACKGROUND ART

A printed wiring board has been formed in the art by stacking a resin sheet and a prepreg on top of a conductor and integrating the resin sheet and the prepreg together to form an insulating layer as a cured product of the resin sheet and the prepreg and by embedding the conductor in the cured product of the resin sheet.

For example, Patent Literature 1 teaches manufacturing a multilayer printed wiring board by forming a stack with a thermally meltable resin film with thermosetting properties interposed between exposed surfaces of via holes of a board and a prepreg containing an inorganic filler.

CITATION LIST

Patent Literature

Patent Literature 1: JP 2003-37362 A

SUMMARY OF INVENTION

The problem to be overcome by the present disclosure is to provide a thermosetting resin sheet that makes it easier, while an insulating layer where a conductor is to be embedded is being formed, to embed the conductor in the insulating layer and reduces the chances of causing a decline in moldability and also provide a printed wiring board including an insulating layer formed out of the thermosetting resin sheet.

A thermosetting resin sheet according to an aspect of the present disclosure includes a prepreg layer and a resin sheet layer stacked on the prepreg layer. The prepreg layer includes a base member and an uncured product or semi-cured product of a first thermosetting resin composition impregnated into the base member. The resin sheet layer is an uncured product or semi-cured product of a second thermosetting resin composition. A curing time of the resin sheet layer is longer than a curing time of the prepreg layer.

A printed wiring board according to an aspect of the present disclosure includes: a core member including an insulating substrate and a conductor laid on top of the insulating substrate; and an insulating layer stacked over the core member to face the conductor and formed out of a cured product of the thermosetting resin sheet described above. The insulating layer includes: a first layer that is a cured product of the prepreg layer; and a second layer that is a cured product of the resin sheet layer and provided closer to the conductor than the first layer is. The conductor is embedded in the second layer.

DESCRIPTION OF EMBODIMENTS

According to the investigation carried out by the present inventors, to manufacture a multilayer printed wiring board having an internal conductor with a sufficient thickness, a prepreg, of which the resin content is large enough to fill the gaps of the internal conductor with the resin, needs to be used. Nevertheless, the prepreg includes a base member (which is generally a piece of glass cloth) and therefore, its resin content has a limit. The fillability may be improved by using a resin sheet including no base member instead of the prepreg. However, the resin sheet includes no glass cloth, and therefore, allows the amount of resin flowing during the multilayer molding process to increase, thus eventually making the amount of resin that fills the gaps of the conductor insufficient, which is a problem.

Thus, to overcome such a problem, the present inventors carried out research and development to obtain a thermosetting resin sheet that makes it easier to embed a conductor in an insulating layer and reduces the chances of causing a decline in moldability while the insulating layer is being formed with the conductor embedded therein, thus conceiving the concept of the present disclosure.

Next, an exemplary embodiment of the present disclosure will be described. Note that the embodiment to be described below is only an exemplary one of various embodiments of the present disclosure and should not be construed as limiting. Rather, the exemplary embodiment may be readily modified in various manners depending on a design choice without departing from the scope of the present disclosure.

Figure 1A:
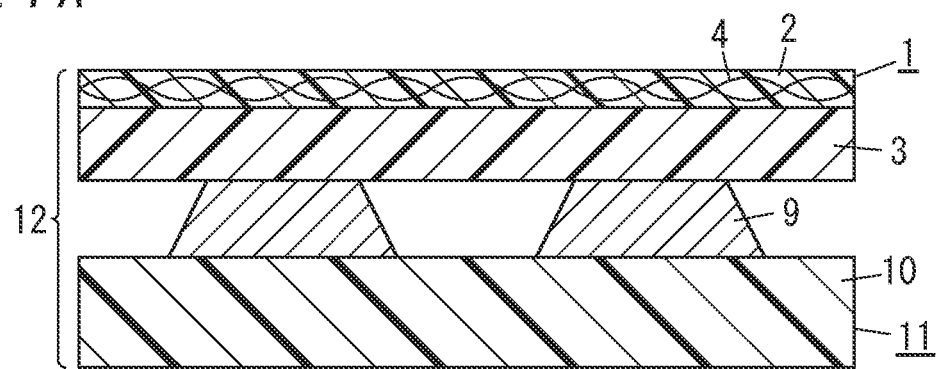
FIG. 1A is a schematic cross-sectional view illustrating a thermosetting resin sheet according to an exemplary embodiment of the present disclosure, a core member, and a stack made up of the thermosetting resin sheet and the core member.

As shown in FIG. 1A, a thermosetting resin sheet 1 according to this embodiment includes a prepreg layer 2 and a resin sheet layer 3 stacked on the prepreg layer 2. The prepreg layer 2 includes a base member 4 and an uncured product or semi-cured product of a first thermosetting resin composition impregnated into the base member 4. The resin sheet layer 3 is an uncured product or semi-cured product of a second thermosetting resin composition. The curing time of the resin sheet layer 3 is longer than a curing time of the prepreg layer 2.

As used herein, the "curing time" refers to the time it takes for the resin sheet layer 3 and the prepreg layer 2 to be cured in a situation where each of the resin sheet layer 3 and the prepreg layer 2 is heated under the same temperature condition that makes both of the resin sheet layer 3 and the prepreg layer 2 curable. The curing time is the curing time at a temperature of 170° C. and is measured in compliance with the JIS C6521-1996 standard, for example. The curing time is measured by stirring about 0.2 g of resin powder of the resin sheet layer 3 or the prepreg layer 2 on a hot plate at 170° C. and measuring the time it takes for powder to gelatinize.

An insulating layer 8 in which the conductor 9 is embedded may be formed out of this thermosetting resin sheet 1. This allows the thermosetting resin sheet 1 to be used, for example, to form an insulating layer 8 of a printed wiring board 5. According to this embodiment, forming the insulating layer 8 in which the conductor is embedded out of the thermosetting resin sheet 1 makes it easier to embed the conductor 9 in the insulating layer 8 and reduces the chances of causing a decline in moldability.

Figure 1B:
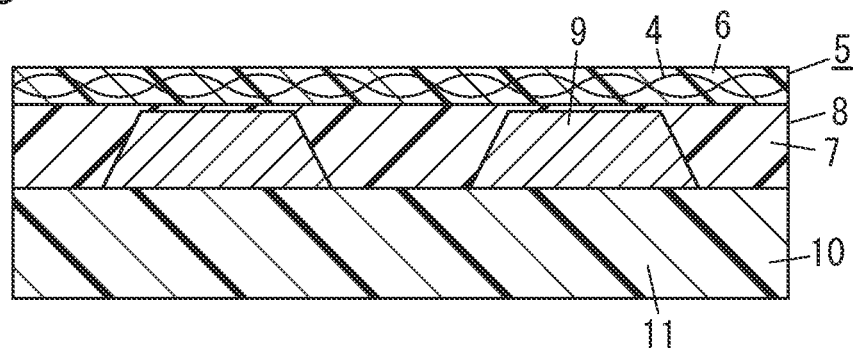
FIG. 1B is a schematic cross-sectional view of a printed wiring board according to the exemplary embodiment of the present disclosure.

Next, it will be described with reference to FIGS. 1A and 1B how to form the insulating layer 8 and how to manufacture the printed wiring board 5.

A method for manufacturing the printed wiring board 5 includes the steps of: providing a core member 11 including an insulating substrate 10 and a conductor 9 laid on top of the insulating substrate 10 and a thermosetting resin sheet 1; stacking the core member 11 and the thermosetting resin sheet 1 one on top of the other such that the conductor 9 faces the resin sheet layer 3; and heating the thermosetting resin sheet 1 to cause the resin sheet layer 3 to flow and then be cured and thereby form a second layer 7 and to cause the prepreg layer 2 to be cured and thereby form a first layer 6.

Specifically, first, a core member 11 and a thermosetting resin sheet 1 are provided. The core member 11 includes an insulating substrate 10 and a conductor 9 laid on top of the insulating substrate 10. Any materials may be used for the insulating substrate 10 and the conductor 9 without limitation as long as the materials may be used as materials to make a printed wiring board. The insulating substrate 10 may be, for example, a glass substrate or a resin substrate such as an epoxy resin substrate. The conductor 9 is wiring made of copper and formed by, for example, an additive process or a subtractive process.

Next, the core member 11 and the thermosetting resin sheet 1 are stacked one on top of the other such that the conductor 9 and the resin sheet layer 3 face each other, thereby obtaining a stack 12 as shown in FIG. 1A.

Subsequently, the thermosetting resin sheet 1 is heated to cause the resin sheet layer 3 to flow and then be cured and thereby form a second layer 7 and to cause the prepreg layer 2 to be cured and thereby form a first layer 6. In this manner, an insulating layer 8 including the first layer 6 and the second layer 7 is formed. Specifically, the stack 12 is hot-pressed, for example. Then, the resin sheet layer 3 in the thermosetting resin sheet 1 either softens or melts first to come to have a decreased viscosity and flow in such a manner as to follow the shape of the conductor 9. In this manner, the conductor 9 is embedded in the resin sheet layer 3. Subsequently, the resin sheet layer 3 is cured. As a result, the second layer 7 is formed as a cured product of the resin sheet layer 3 and the conductor 9 is embedded in the second layer 7. In the same way, the prepreg layer 2 also either softens or melts first to come to have a decreased viscosity and flow and then be cured. Thus, a first layer 6 is formed as a cured product of the prepreg layer 2. In this manner, the printed wiring board 5 shown in FIG. 1B is manufactured.

The printed wiring board 5 includes the core member 11 and the insulating layer 8. The core member 11 includes the insulating substrate 10 and the conductor 9 laid on top of the insulating substrate 10. The insulating layer 8 is stacked on the core member 11 to face the conductor 9. The insulating layer 8 is made of a cured product of the thermosetting resin sheet 1. The insulating layer 8 includes the first layer 6 that is a cured product of the prepreg layer 2 and the second layer 7 that is a cured product of the resin sheet layer 3. The second layer 7 is provided closer to the conductor 9 than the first layer 6 is. The conductor 9 is embedded in the second layer 7.

Manufacturing the printed wiring board 5 in this manner enables embedding the conductor 9 in the insulating layer 8 by causing the resin sheet layer 3 that has softened or melted to flow and makes it easier to improve the reliability of the printed wiring board 5 in a high-temperature environment because the conductor 9 in the insulating layer 8 is unlikely to contact with the base member 4 in the prepreg layer 2. In addition, in the insulating layer 8, the base member 4 is not provided in the second layer 7 but is provided in the first layer 6, thus enabling reducing the number of the base members 4 to use and making it easier to reduce the thickness of the insulating layer 8.

In this embodiment, the curing time of the resin sheet layer 3 is longer than the curing time of the prepreg layer 2 as described above. That is to say, if the resin sheet layer 3 and the prepreg layer 2 are simultaneously heated under the same condition, then the prepreg layer 2 will be cured earlier than the resin sheet layer 3. Thus, in the process of forming the insulating layer 8 out of the thermosetting resin sheet 1, the prepreg layer 2 increases its hardness while the resin sheet layer 3 that has softened or melted is flowing. Thus, the prepreg layer 2 may reduce the chances of the entire thermosetting resin sheet 1 being deformed even if the resin sheet layer 3 is flowing. In addition, this makes it easier for the prepreg layer 2 to apply moderate pressure to the resin sheet layer 3 uniformly, thus promoting the flow of the resin sheet layer 3 to follow the shape of the conductor 9. Furthermore, even if the resin sheet layer 3 is caused to flow sufficiently, the prepreg layer 2 hardly flows, thus reducing the chances of the resin flowing out of the thermosetting resin sheet 1.

This may reduce, even if the conductor 9 is rather thick, the chances of leaving unfilled gaps between the insulating layer 8 and the conductor 9 and causing deformation such as a dispersion in thickness in the insulating layer 8.

Next, the thermosetting resin sheet 1 will be described more specifically.

The thermosetting resin sheet 1 includes the prepreg layer 2 and the resin sheet layer 3 as described above.

The prepreg layer 2 includes the base member 4 and an uncured product or semi-cured product of a first thermosetting resin composition impregnated into the base member 4.

The base member 4 may be, for example, a piece of inorganic fiber woven fabric, inorganic fiber non-woven fabric, organic fiber woven fabric, or organic fiber non-woven fabric. The inorganic fiber may be, for example, a glass fiber or a fiber of an inorganic material other than glass. Examples of the glass as a constituent material for the glass fiber include E glass, D glass, S glass, NE glass, T glass, and quartz. Examples of the organic fiber include an aramid fiber, a poly(paraphenylenebenzobisoxazole) (PBO) fiber, a poly(benzoimidazole) (PBI) fiber, a poly(tetrafluoroethylene) (PTFE) fiber, a poly(paraphenylenebenzobisthiazole) (PBZT) fiber, and a fully aromatic polyester fiber.

Any resin composition may be used as the first thermosetting resin composition without limitation as long as the resin composition may be used to form the insulating layer 8 of the printed wiring board 5.

The prepreg layer 2 may be formed by, for example, impregnating the first thermosetting resin composition into the base member 4 and then heating the first thermosetting resin composition to either dry or semi-cure the first thermosetting resin composition. The condition for heating the first thermosetting resin composition may be adjusted as appropriate according to the chemical makeup of the first thermosetting resin composition and the physical properties to be imparted to the prepreg layer 2.

The prepreg layer 2 may have a thickness equal to or greater than 40 μm and equal to or less than 200 μm, for example. In the example illustrated in FIG. 1A, the prepreg layer 2 consists of a single prepreg. However, this is only an example and should not be construed as limiting. Alternatively, the prepreg layer 2 may also be made up of a plurality of prepregs that are stacked one on top of another.

On the other hand, the resin sheet layer 3 is an uncured product or semi-cured product of a second thermosetting resin composition.

Any resin composition may be used as the second thermosetting resin composition without limitation as long as the resin composition may be used to form the insulating layer 8 of the printed wiring board 5.

The second thermosetting resin composition may have either the same chemical makeup as, or a different chemical makeup from, the first thermosetting resin composition. That is to say, the respective components included in the second thermosetting resin composition and the compound ratio thereof may be either the same as, or different from, the respective components included in the first thermosetting resin composition and the compound ratio thereof.

When the resin sheet layer 3 is formed, the second thermosetting resin composition is molded into a sheet shape by, for example, an application method. Examples of the application method include a dipping method, a spray method, a spin coating method, a roll coating method, a curtain coating method, and a screen-printing method. Subsequently, the resin sheet layer 3 is formed by heating and thereby drying or semi-curing the second thermosetting resin composition. The condition for heating the second thermosetting resin composition may be adjusted as appropriate according to the chemical makeup of the second thermosetting resin composition and the physical properties to be imparted to the resin sheet layer 3.

The resin sheet layer 3 may have the lowest melt viscosity equal to or greater than 500 Pa·s and equal to or less than 50000 Pa·s, for example.

Also, the resin sheet layer 3 may have a thickness equal to or greater than 30 μm and equal to or less than 400 μm, and preferably has a thickness equal to or greater than 50 μm and equal to or less than 200 μm. In the example illustrated in FIG. 1A, the resin sheet layer 3 consists of a single resin sheet. However, this is only an example and should not be construed as limiting. Alternatively, the resin sheet layer 3 may also be made up of a plurality of resin sheets that are stacked one on top of another.

Each of the first thermosetting resin composition and the second thermosetting resin composition contains a thermosetting resin. The thermosetting resin contains at least one selected from the group consisting of, for example, an epoxy resin, a polyimide resin, a phenolic resin, a bismaleimide triazine resin, and a thermosetting polyphenylene ether resin. The epoxy resin contains at least one component selected from the group consisting of, for example, bisphenol A epoxy resins, bisphenol F epoxy resins, cresol-novolac epoxy resins, bisphenol A novolac epoxy resins, bisphenol F novolac epoxy resins, naphthalene epoxy resins, biphenyl epoxy resins, dicyclopentadiene epoxy resins, and polyfunctional epoxy resins. Note that these are only exemplary components that may be included in the thermosetting resin and should not be construed as limiting.

Each of the first thermosetting resin composition and the second thermosetting resin composition may further contain an appropriate additive selected from the group consisting of a curing agent, a curing accelerator, a flame retardant, and an inorganic filler. The second thermosetting resin composition may further contain a solvent. The curing agent contains at least one selected from the group consisting of, for example, diamine-based curing agents, bifunctional or higher-functional phenolic curing agents, acid anhydride-based curing agents, dicyandiamide, and low-molecular weight polyphenylene ether compounds. The curing accelerator contains at least one selected from the group consisting of, for example, imidazole compounds, tertiary amine compounds, organic phosphine compounds, and metal soaps. The flame retardant contains at least one selected from the group consisting of, for example, halogen-based flame retardants and non-halogen-based flame retardants. The inorganic filler contains at least one selected from the group consisting of, for example, silica, aluminum hydroxide, magnesium hydroxide, aluminum silicate, magnesium silicate, talc, clay, mica, and molybdenum compounds. The solvent contains at least one selected from the group consisting of, for example, appropriate organic solvents and water. Note that these are only exemplary components that may be included in each of the first thermosetting resin composition and the second thermosetting resin composition and should not be construed as limiting.

As described above, the curing time of the resin sheet layer 3 is longer than the curing time of the prepreg layer 2. To make such a difference in curing time, an appropriate means may be adopted. For example, setting the heating duration of the first thermosetting resin composition when forming the prepreg layer 2 at a longer time than the heating duration of the second thermosetting resin composition when forming the resin sheet layer 3 makes the degree of curing of the uncured or semi-cured product of the first thermosetting resin composition in the prepreg layer 2 more advanced than the degree of curing of the uncured product or semi-cured product of the second thermosetting resin composition in the resin sheet layer 3, thus enabling making the curing time of the resin sheet layer 3 longer than the curing time of the prepreg layer 2. Alternatively, selecting a combination of the thermosetting resin and the curing agent in each of the first thermosetting resin composition and the second thermosetting resin composition such that the reactivity between the thermosetting resin and the curing agent in the second thermosetting resin composition is higher than the reactivity between the thermosetting resin and the curing agent in the first thermosetting resin composition may also make the curing time of the resin sheet layer 3 longer than the curing time of the prepreg layer 2. Still alternatively, selecting the type and content of the curing accelerator in the first thermosetting resin composition and the type and content of the curing accelerator in the second thermosetting resin composition to accelerate the curing reaction in the second thermosetting resin composition more significantly than the curing reaction in the first thermosetting resin composition may also make the curing time of the resin sheet layer 3 longer than the curing time of the prepreg layer 2. Optionally, the curing time of the resin sheet layer 3 may also be made longer than the curing time of the prepreg layer 2 by adopting a plurality of means in combination.

The curing time of the prepreg layer 2 and the curing time of the resin sheet layer 3 may be set as appropriate. For example, the curing time of the prepreg layer 2 is preferably equal to or longer than 30 seconds and shorter than 360 seconds. The curing time of the resin sheet layer 3 is preferably longer than 30 seconds and equal to or shorter than 360 seconds. This makes it easier, when the insulating layer 8 is formed out of the thermosetting resin sheet 1 by hot pressing, to cause the resin sheet layer 3 that has softened or melted to flow smoothly enough to embed the conductor 9 in the resin sheet layer 3 without leaving any unfilled gaps and to particularly significantly reduce the chances of causing a decline in moldability by preventing the resin sheet layer 3 from flowing excessively. The curing time of the prepreg layer 2 is more preferably equal to or longer than 50 seconds and equal to or shorter than 240 seconds and even more preferably equal to or longer than 60 seconds and equal to or shorter than 180 seconds. The curing time of the resin sheet layer 3 is more preferably equal to or longer than 60 seconds and equal to or shorter than 270 seconds and even more preferably equal to or longer than 75 seconds and equal to or shorter than 240 seconds.

The difference between the curing time of the resin sheet layer 3 and the curing time of the prepreg layer 2 is preferably equal to or longer than 1 second and equal to or shorter than 180 seconds. This allows the prepreg layer 2 that has started to be cured earlier than the resin sheet layer 3 while the insulating layer 8 is formed out of the thermosetting resin sheet 1 by hot pressing to particularly effectively prevent the thermosetting resin sheet 1 being molded from causing excessive deformation and outflow of the resin. Thus, this particularly significantly reduces the chances of causing a decline in moldability. The difference in the curing time is more preferably equal to or longer than 5 seconds and equal to or shorter than 120 seconds, and even more preferably equal to or longer than 10 seconds and equal to or shorter than 90 seconds.

The resin sheet layer 3 and the prepreg layer 2 are, for example, directly in contact with each other and are bonded to each other. For that purpose, when the thermosetting resin sheet 1 is manufactured, the first thermosetting resin composition may be, for example, impregnated into the base member 4 and then heated to make an intermediate product. After the second thermosetting resin composition has been applied onto this intermediate product, the first thermosetting resin composition and the second thermosetting resin composition are heated. In this manner, the thermosetting resin sheet 1 may be manufactured by forming and bonding together the resin sheet layer 3 and the prepreg layer 2. According to this method, the heating duration of the first thermosetting resin composition becomes longer than the heating duration of the second thermosetting resin composition, thus allowing the curing time of the resin sheet layer 3 to be adjusted to be longer than the curing time of the prepreg layer 2.

Alternatively, the thermosetting resin sheet 1 may also be manufactured by forming the resin sheet layer 3 and the prepreg layer 2 separately from each other and then laminating the resin sheet layer 3 and the prepreg layer 2 together by an appropriate method.

Still alternatively, the thermosetting resin sheet 1 may also be manufactured by forming the resin sheet layer 3 and the prepreg layer 2 separately from each other and then just stacking the resin sheet layer 3 and the prepreg layer 2 one on top of the other without bonding them together.

As described above, the insulating layer 8 may be formed out of the thermosetting resin sheet 1 and a printed wiring board 5 including the insulating layer 8 may be manufactured.

When the printed wiring board 5 is manufactured, the conductor 9 to be embedded in the insulating layer 8 may have a thickness equal to or greater than 100 μm and equal to or less than 500 μm, for example. This embodiment makes it easier, even if the conductor 9 has such a large thickness, to embed the conductor 9 in the insulating layer 8 and reduces the chances of causing a decline in moldability. In addition, when the conductor 9 has such a large thickness, the value of an electric current that can flow through the conductor 9 may be increased accordingly. This enables applying the printed wiring board 5 to industrial devices, onboard equipment, and other devices that demand a large amount of current. The conductor 9 more preferably has a thickness equal to or greater than 140 μm and equal to or less than 450 μm, and even more preferably has a thickness equal to or greater than 175 μm and equal to or less than 400 μm. Note that these are only exemplary ranges of the thickness of the conductor 9 and should not be construed as limiting.

If the printed wiring board 5 is manufactured by hot-pressing the stack 12 as described above, then the stack 12 may further include a sheet of metal foil. That is to say, the stack 12 may be formed by stacking the core member 11 and the thermosetting resin sheet 1 one on top of the other such that the conductor 9 and the resin sheet layer 3 face each other and by stacking a sheet of metal foil on the thermosetting resin sheet 1 such that the sheet of metal foil faces the prepreg layer 2 and then the stack 12 may be hot-pressed. In that case, a printed wiring board 5 including the sheet of metal foil stacked on the insulating layer 8 is obtained. Optionally, conductor wiring may be formed by patterning the sheet of metal foil by etching process, for example. In that case, a printed wiring board 5 including conductor wiring laid on top of the insulating layer 8 is obtained.

The condition for hot-pressing the stack 12 may be set as appropriate according to, for example, the respective chemical makeups of the first thermosetting resin composition and the second thermosetting resin composition. For example, the heating temperature may be equal to or higher than 120° C. and equal to or lower than 250° C., the press pressure may be equal to or higher than 0.5 MPa and equal to or lower than 5 MPa, and the treatment time may be equal to or longer than 30 minutes and equal to or shorter than 180 minutes.

EXAMPLES

Next, more specific examples of this embodiment will be described. Note that the examples to be described below are only examples of this embodiment and should not be construed as limiting.

(1) Formation of Thermosetting Resin Sheet

A first thermosetting resin composition was prepared by mixing respective components shown in the "chemical makeup" column of the prepreg layer in Tables 1 and 2. A second thermosetting resin composition was also prepared by mixing respective components shown in the "chemical makeup" column of the resin sheet layer in Tables 1 and 2. The following are the details of those components shown in Tables 1 and 2:

Bisphenol A epoxy resin: product number YD-128 manufactured by NIPPON STEEL Chemical & Materials Co., Ltd.;

Brominated epoxy resin: product number YDB-500 manufactured by NIPPON STEEL Chemical & Materials Co., Ltd.;

Novolac epoxy resin: product number YDCN-220 manufactured by NIPPON STEEL Chemical & Materials Co., Ltd.;

Phenoxy resin: product number YP-50 manufactured by NIPPON STEEL Chemical & Materials Co., Ltd.;

Curing agent: dicyandiamide manufactured by Nippon Carbide Industries, Co., Inc;

Curing accelerator: 2-ethyl-4-methylimidazole, product number 2E4MZ manufactured by Shikoku Chemicals Corporation;

Silica: product number SO25R manufactured by Admatechs; and

Aluminum hydroxide: product number CL-303 manufactured by Sumitomo Chemical Co., Ltd.

The first thermosetting resin composition was impregnated into glass cloth with IPC specification shown in Tables 1 and 2 and then was heated under the condition shown in the first heat treatment column in Tables 1 and 2 to make an intermediate product. In this manner, a prepreg was formed in Comparative Examples 3-5. In Examples 1-6 and Comparative Examples 1 and 2, the second thermosetting resin composition was applied onto the intermediate product formed by the first heat treatment and then the first thermosetting resin composition and the second thermosetting resin composition were heated under the condition shown in the second heat treatment column in Tables 1 and 2. In this manner, a thermosetting resin sheet including a prepreg layer and a resin sheet layer was manufactured.

The resin content, thickness, and curing time measured at 170° C. in compliance with the JIS C6521-1996 with respect to the prepreg layer in the thermosetting resin sheet and the thickness and curing time measured at 170° C. in compliance with the JIS C6521-1996 with respect to the resin sheet layer thereof are shown in Tables 1 and 2.

2. Manufacturing of Printed Wiring Board

A core member, including an insulating substrate and copper wiring on the insulating substrate, was provided. The thickness and residual copper ratio of the wiring are as shown in Tables 1 and 2.

In Examples 1-6 and Comparative Examples 1 and 2, a stack was formed by stacking the thermosetting resin sheet and the core member one on top of the other such that the resin sheet layer and the wiring (conductor) faced each other. The stack was hot-pressed under the condition including the highest heating temperature of 170° C., a press pressure of 3 MPa, and a treatment time of 60 minutes.

In Comparative Examples 3 and 4, a stack was formed by stacking two prepregs and a core member one on top of another. The stack was hot-pressed under the condition including the highest heating temperature of 170° C., a press pressure of 3 MPa, and a treatment time of 60 minutes.

In Comparative Example 5, a stack was formed by stacking a prepreg and a core member one on top of the other. The stack was hot-pressed under the condition including the highest heating temperature of 170° C., a press pressure of 4 MPa, and a treatment time of 60 minutes.

In this manner, printed wiring boards were manufactured.

3. Evaluation (1) Fillability

The insulating layer of each of the printed wiring boards thus manufactured was inspected with the naked eye. A printed wiring board in which no voids were recognized in the insulating layer was evaluated to be a "GO" and a printed wiring board in which voids were recognized in the insulating layer was evaluated to be a "NO-GO."

(2) Solder Heat Resistance after Having been Boiled

With each printed wiring board immersed in water, the water was heated to 100° C. After having been left for 2 hours, the printed wiring board was picked out of the water. After the water had been wiped away from the surfaces of the printed wiring board, the printed wiring board was soaked in a solder bath at 288° C. for 20 seconds in an autoclave. Subsequently, the printed wiring board was inspected with the naked eye. A printed wiring board in which no swell of the insulating layer was recognized was evaluated to be a "GO" and a printed wiring board in which swell of the insulating layer was recognized was evaluated to be a "NO-GO."

TABLE 1

| | | | Examples | | | | | |
|---|---|---|---|---|---|---|---|---|
| | | | 1 | 2 | 3 | 4 | 5 | 6 |
| Materials of prepreg layer | Resin chemical makeup (parts by mass) | Bisphenol A epoxy resin | 5 | 5 | 5 | 5 | 5 | 5 |
| | | Brominated epoxy resin | 80 | 80 | 80 | 80 | 80 | 80 |
| | | Novolac epoxy resin | 5 | 5 | 5 | 5 | 5 | 5 |
| | | Phenoxy resin | 10 | 10 | 10 | 10 | 10 | 10 |
| | | Curing agent | 2.2 | 2.2 | 2.2 | 2.2 | 2.2 | 2.2 |
| | | Curing accelerator | 0.1 | 0.1 | 0.1 | 0.1 | 0.04 | 0.1 |
| | | Silica | 20 | 20 | 20 | 20 | 20 | 20 |
| | | Aluminum hydroxide | 30 | 30 | 30 | 30 | 30 | 30 |
| | Glass cloth (IPC specification) | | 2116 | 7628 | 1080 | 2116 | 2116 | 2116 |
| Materials of resin sheet layer | Resin chemical makeup (parts by mass) | Bisphenol A epoxy resin | 5 | 5 | 5 | 5 | 5 | 5 |
| | | Brominated epoxy resin | 80 | 80 | 80 | 80 | 80 | 80 |
| | | Novolac epoxy resin | 5 | 5 | 5 | 5 | 5 | 5 |
| | | Phenoxy resin | 10 | 10 | 10 | 10 | 10 | 10 |
| | | Curing agent | 2.2 | 22 | 22 | 2.2 | 2.2 | 2.2 |
| | | Curing accelerator | 0.1 | 0.1 | 0.1 | 0.1 | 0.1 | 0.1 |
| | | Silica | 20 | 20 | 20 | 20 | 20 | 20 |
| | | Aluminum hydroxide | 30 | 30 | 30 | 30 | 30 | 30 |
| Thermosetting resin sheet | Forming condition | 1st heat treatment (heating temperature/ heating duration) | 150° C./ 4 min. | 150° C./ 4 min. | 150° C./ 3 min. | 150° C. 4 min. | 140° C./ 4 min. | 150° C./ 4 min. |

TABLE 1-continued

|  |  |  | Examples | | | | | |
| --- | --- | --- | --- | --- | --- | --- | --- | --- |
|  |  |  | 1 | 2 | 3 | 4 | 5 | 6 |
|  |  | 2$^{nd}$ heat treatment (heating temperature/ heating duration) | 150° C./ 6 min. | 150° C./ 6 min. | 150° C./ 6 min. | 150° C./ 7 min. | 150° C./ 6 min. | 150° C./ 7 min. |
|  | Prepreg layer | Thickness (μm) | 100 | 185 | 85 | 100 | 100 | 125 |
|  |  | Resin content (% by mass) | 47 | 43 | 68 | 47 | 47 | 55 |
|  |  | Curing time at 170° C. | 1 min 25 s | 1 min 25 s | 1 min 25 s | 1 min 10 s | 2 min 00 s | 1 min 40 s |
|  | Resin sheet layer | Thickness (μm) | 100 | 100 | 100 | 150 | 100 | 200 |
|  |  | Curing time at 170° C. | 2 min 15 s | 2 min 15 s | 2 min 15 s | 2 min 15 s | 2 min 15 s | 2 min 20 s |
|  |  | Number of base members | 1 | 1 | 1 | 1 | 1 | 1 |
| Core member |  | Thickness (μm) of wiring | 210 | 210 | 210 | 210 | 210 | 420 |
|  |  | Residual copper ratio (%) of wiring | 50 | 50 | 50 | 50 | 50 | 50 |
| Evaluation |  | Fillability | GO | GO | GO | GO | GO | GO |
|  |  | Solder heat resistance after having been boiled | GO | GO | GO | GO | GO | GO |

TABLE 2

|  |  |  | Comparative Examples | | | | |
| --- | --- | --- | --- | --- | --- | --- | --- |
|  |  |  | 1 | 2 | 3 | 4 | 5 |
| Materials of prepreg layer | Resin chemical makeup (parts by mass) | Bisphenol A epoxy resin | 5 | 5 | 5 | 5 | 5 |
|  |  | Brominated epoxy resin | 80 | 80 | 80 | 80 | 80 |
|  |  | Novolac epoxy resin | 5 | 5 | 5 | 5 | 5 |
|  |  | Phenoxy resin | 10 | 10 | 10 | 10 | 10 |
|  |  | Curing agent | 2.2 | 2.2 | 2.2 | 2.2 | 2.2 |
|  |  | Curing accelerator | 0.02 | 0.02 | 0.1 | 0.1 | 0.1 |
|  |  | Silica | 20 | 20 | 20 | 20 | 20 |
|  |  | Aluminum hydroxide | 30 | 30 | 30 | 30 | 30 |
|  | Glass cloth (IPC specification) |  | 2116 | 7628 | 2116 | 2116 | 7628 |
| Materials of resin sheet layer | Resin chemical makeup (parts by mass) | Bisphenol A epoxy resin | 5 | 5 | — | — | — |
|  |  | Brominated epoxy resin | 80 | 80 | — | — | — |
|  |  | Novolac epoxy resin | 5 | 5 | — | — | — |
|  |  | Phenoxy resin | 10 | 10 | — | — | — |
|  |  | Curing agent | 2.2 | 2.2 | — | — | — |
|  |  | Curing accelerator | 0.2 | 0.2 | — | — | — |
|  |  | Silica | 20 | 20 | — | — | — |
|  |  | Aluminum hydroxide | 30 | 30 | — | — | — |
| Thermosetting resin sheet | Forming condition | 1$^{st}$ heat treatment (heating temperature/ heating duration) | 140° C./ 3 min. | 140° C./ 4 min. | 150° C./ 6 min. | 150° C./ 7 min. | 150° C./8 min. |
|  |  | 2$^{nd}$ heat treatment (heating temperature/ heating duration) | 150° C./ 4 min. | 150° C./ 5 min. | — | — | — |
|  | Prepreg layer | Thickness (μm) | 100 | 185 | 100 | 125 | 230 |
|  |  | Resin content (% by mass) | 47 | 43 | 47 | 55 | 52 |
|  |  | Curing time at 170° C. | 2 min 30 s | 2 min 30 s | 2 min 20 s | 2 min 20 s | 2 min 20 s |
|  | Resin sheet layer | Thickness (μm) | 100 | 100 | — | — | — |
|  |  | Curing time at 170° C. | 2 min 15 s | 2 min 15 s | — | — | — |
|  |  | Number of base members | 1 | 1 | 2 | 2 | 1 |
| Core member |  | Thickness (μm) of wiring | 210 | 210 | 210 | 210 | 210 |
|  |  | Residual copper ratio (%) of wiring | 50 | 50 | 50 | 50 | 50 |
| Evaluation |  | Fillability | NO-GO | GO | NO-GO | GO | GO |
|  |  | Solder heat resistance after having been boiled | NO-GO | NO-GO | NO-GO | NO-GO | NO-GO |

These results reveal that in Example 1, the curing time of the resin sheet layer was longer than the curing time of the prepreg layer, and therefore, Example 1 turned out to have good fillability and good solder heat resistance after having been boiled.

In Examples 2 and 3, the prepreg layer had its thickness changed from in Example 1 by changing the glass cloth of the prepreg layer. However, as in Example 1, the curing time of the resin sheet layer was longer than the curing time of the prepreg layer, and therefore, Examples 2 and 3 also turned out to have good fillability and good solder heat resistance after having been boiled.

In Example 4, the thickness of the resin sheet layer was increased compared to Example 1. However, as in Example 1, the curing time of the resin sheet layer was longer than the curing time of the prepreg layer, and therefore, Example 4 also turned out to have good fillability and good solder heat resistance after having been boiled. Note that Example 4 included a thicker resin sheet layer and would achieve a higher degree of fillability than Example 1.

In Example 5, the blending quantity of the curing accelerator in the first thermosetting resin composition was decreased compared to Example 1 and the heating temperature in the first heat treatment was set at a lower temperature than in Example 1, thereby narrowing the difference between the curing time of the resin sheet layer and the curing time of the prepreg layer compared to Example 1. However, the curing time of the resin sheet layer was longer than the curing time of the prepreg layer, and therefore, Example 5 also turned out to have good fillability and good solder heat resistance after having been boiled.

In Example 6, the resin sheet layer was even thicker than the counterpart of Example 4. Thus, even though the wiring of the core member had as large a thickness as 420 μm, Example 6 also turned out to have good solder heat resistance after having been boiled.

In Comparative Examples 1 and 2, the blending quantity of the curing accelerator in the first thermosetting resin composition was further decreased compared to Example 5 and the heating temperature in the first heat treatment was set at a lower temperature than in Example 5, thereby making the curing time of the resin sheet layer shorter than the curing time of the prepreg layer. In this case, in Comparative Example 1, the fillability and the solder heat resistance after having been boiled both deteriorated. In Comparative Example 2, the resin sheet layer was thicker than in Comparative Example 1, and therefore, the fillability thereof turned out to be good but the solder heat resistance after having been boiled deteriorated. This is probably because in the insulating layer, the glass cloth was so close to the wiring at some points that some swell would have been produced from those points.

In Comparative Example 3, no resin sheet layer was used, and therefore, the fillability and the solder heat resistance after having been boiled both deteriorated. In Comparative Examples 4 and 5, the prepreg layer was thicker than in Comparative Example 3, and therefore, the fillability thereof turned out to be good but the solder heat resistance after having been boiled deteriorated. This is probably because the ratio of the glass cloth in the insulating layer was so high as to make the glass cloth so close to the wiring at some points that some swell would have been produced from those points.

REFERENCE SIGNS LIST

1 Thermosetting Resin Sheet
2 Prepreg Layer
3 Resin Sheet Layer
4 Base Member
5 Printed Wiring Board
6 First Layer
7 Second Layer
8 Insulating Layer
9 Conductor

The invention claimed is:

1. A thermosetting resin sheet consisting of:
a prepreg layer including a base member and a semi-cured product of a first thermosetting resin composition impregnated into the base member; and
a resin sheet layer stacked on the prepreg layer, wherein:
the resin sheet layer is a semi-cured product of a second thermosetting resin composition,
each of the first thermosetting resin composition and the second thermosetting resin composition contains a thermosetting resin and an additive selected from the group consisting of a curing agent, a curing accelerator, a flame retardant, and an inorganic filler,
the prepreg layer and the resin sheet layer are in a condition that, a curing time to further cure the resin sheet layer is longer than a curing time to further cure the prepreg layer,
the prepreg layer and the resin sheet layer are in a condition that the semi-cured product of the first thermosetting resin composition in the prepreg layer has been cured in a more advanced degree than the semi-cured product of the second thermosetting resin composition in the resin sheet layer,
the curing time to further cure the resin sheet layer is a time to gelatinize resin powder of the resin sheet layer at a temperature of 170° C. and is measured in compliance with the JIS C6521-1996 standard, and
the curing time to further cure the prepreg layer is a time to gelatinize resin powder of the prepreg layer at a temperature of 170° C. and is measured in compliance with the JIS C6521-1996 standard.

2. The thermosetting resin sheet of claim 1, wherein
a difference between the curing time to further cure the resin sheet layer and the curing time to further cure the prepreg layer is equal to or longer than 1 second and equal to or shorter than 180 seconds.

3. The thermosetting resin sheet of claim 1, wherein
the curing time to further cure the prepreg layer is equal to or longer than 30 seconds and shorter than 360 seconds, and
the curing time to further cure the resin sheet layer is longer than 30 seconds and equal to or shorter than 360 seconds.

4. A printed wiring board comprising:
a core member, the core member including an insulating substrate and a conductor stacked on the insulating substrate; and
an insulating layer stacked over the core member to face the conductor and formed out of a cured product of the thermosetting resin sheet of claim 1,
the insulating layer including a first layer that is a cured product of the prepreg layer and a second layer that is a cured product of the resin sheet layer and provided closer to the conductor than the first layer,
the conductor being embedded in the second layer.

5. The printed wiring board of claim 4, wherein
the conductor has a thickness equal to or greater than 100 μm and equal to or less than 500 μm.

6. The thermosetting resin sheet of claim 2, wherein
the curing time to further cure the prepreg layer is equal to or longer than 30 seconds and shorter than 360 seconds, and
the curing time to further cure the resin sheet layer is longer than 30 seconds and equal to or shorter than 360 seconds.

7. A printed wiring board comprising:
a core member, the core member including an insulating substrate and a conductor stacked on the insulating substrate; and
an insulating layer stacked over the core member to face the conductor and formed out of a cured product of the thermosetting resin sheet of claim 2, wherein:
the insulating layer includes a first layer that is a cured product of the prepreg layer and a second layer that is a cured product of the resin sheet layer and provided closer to the conductor than the first layer, and
the conductor is embedded in the second layer.

8. A printed wiring board comprising:
a core member, the core member including an insulating substrate and a conductor stacked on the insulating substrate; and
an insulating layer stacked over the core member to face the conductor and formed out of a cured product of the thermosetting resin sheet of claim 3, wherein:
the insulating layer includes a first layer that is a cured product of the prepreg layer and a second layer that is a cured product of the resin sheet layer and provided closer to the conductor than the first layer, and
the conductor is embedded in the second layer.

9. The printed wiring board of claim 7, wherein
the conductor has a thickness equal to or greater than 100 μm and equal to or less than 500 μm.

10. The printed wiring board of claim 8, wherein
the conductor has a thickness equal to or greater than 100 μm and equal to or less than 500 μm.

11. A method for manufacturing a printed wiring board,
the printed wiring board comprising:
a core member including an insulating substrate and a conductor stacked on the insulating substrate; and
an insulating layer stacked over the core member to face the conductor, wherein the insulating layer is formed out of a cured product of the thermosetting resin sheet of claim 1,
the insulating layer comprising:
a first layer that is a cured product of the prepreg layer; and
a second layer that is a cured product of the resin sheet layer and provided closer to the conductor than the first layer,
the conductor is embedded in the second layer,
the method comprising:
stacking the core member and the thermosetting resin sheet on top of each other such that the conductor faces the resin sheet layer; and
heating the thermosetting resin sheet
to cause the resin sheet layer to flow and then be cured and thereby form the second layer, and
to cause the prepreg layer to be cured and thereby form the first layer.

12. The method for manufacturing the printed wiring board of claim 11, wherein
the conductor has a thickness equal to or greater than 100 μm and equal to or less than 500 μm.

\* \* \* \* \*